US007636613B2

(12) United States Patent
Borah et al.

(10) Patent No.: US 7,636,613 B2
(45) Date of Patent: Dec. 22, 2009

(54) ACTUATOR CONTROLLER FOR MONITORING HEALTH AND STATUS OF THE ACTUATOR AND/OR OTHER EQUIPMENT

(75) Inventors: Frederic M. Borah, Merrick, NY (US); Richard J. Gavarian, New Hyde Park, NY (US); Anthony Leib, Jr., Commack, NY (US); James Venable, Mineola, NY (US)

(73) Assignee: Curtiss-Wright Flow Control Corporation, Roseland, NJ (US)

( * ) Notice: Subject to any disclaimer, the term of this patent is extended or adjusted under 35 U.S.C. 154(b) by 415 days.

(21) Appl. No.: 11/427,868

(22) Filed: Jun. 30, 2006

(65) Prior Publication Data

US 2007/0005159 A1  Jan. 4, 2007

Related U.S. Application Data (60) Provisional application No. 60/696,115, filed on Jul. 1, 2005.

(51) Int. Cl.
*G05D 11/00* (2006.01)
*G05D 7/00* (2006.01)

(52) U.S. Cl. .................. 700/282; 700/275; 700/27; 707/7; 703/13

(58) Field of Classification Search ............ 700/275, 700/27, 282; 707/7; 703/13
See application file for complete search history.

(56) References Cited

U.S. PATENT DOCUMENTS

| | | | | |
|---|---|---|---|---|
| 3,578,958 | A | * | 5/1971 | Richardson .............. 700/82 |
| 4,816,987 | A | | 3/1989 | Brooks et al. |
| 5,313,386 | A | * | 5/1994 | Cook et al. ............... 700/82 |
| 5,596,263 | A | * | 1/1997 | Zavis et al. .............. 323/255 |
| 5,731,688 | A | * | 3/1998 | Thomson ................ 322/22 |
| 5,848,609 | A | | 12/1998 | Marchesseault et al. |
| 5,997,167 | A | * | 12/1999 | Crater et al. ............. 700/79 |
| 6,016,204 | A | * | 1/2000 | Budnik et al. ........... 358/1.14 |
| 6,272,401 | B1 | | 8/2001 | Boger et al. |
| 6,453,261 | B2 | | 9/2002 | Boger et al. |
| 6,637,267 | B2 | | 10/2003 | Fiebelkorn et al. |
| 6,665,568 | B1 | | 12/2003 | Hott |
| 6,745,084 | B2 | | 6/2004 | Boger et al. |

(Continued)

OTHER PUBLICATIONS

"Diagnosis of process valve actuator faults using a multilayer neural network", Karpenko et al, Control Engineering Practice 11, (2003) 1289-1299.*

*Primary Examiner*—Michael D Masinick
(74) *Attorney, Agent, or Firm*—Pearne & Gordon LLP (57) ABSTRACT

A device for controlling an actuator includes a controller mounted within a housing having an outer surface. The controller is adapted for controlling outputs connected to the actuator for controlling an operation of the actuator. A data input interface receives data from the actuator and/or from other equipment being acted on by the actuator. A memory stores expected parameters of the actuator. An operator interface provided on the housing's outer surface accepts operator commands and/or settings for input to the controller. A display and/or indicator on the housing's outer surface displays an output of the controller. The controller compares the data, and/or derived parameters of the data, with the expected parameters, to monitor a health and status of one or both of the actuator and the other equipment. The controller indicates the health and the status to the operator utilizing the display and/or indicator.

6 Claims, 11 Drawing Sheets

U.S. PATENT DOCUMENTS

| | | |
|---|---|---|
| 6,745,107 B1 | 6/2004 | Miller |
| 6,839,597 B2 | 1/2005 | Hattori et al. |
| 6,862,547 B2 | 3/2005 | Snowbarger et al. |
| 2002/0111712 A1* | 8/2002 | Peshkin et al. .............. 700/230 |
| 2003/0105535 A1 | 6/2003 | Rammler |
| 2004/0089346 A1 | 5/2004 | Sutardja |
| 2004/0098148 A1 | 5/2004 | Retlich et al. |

* cited by examiner

| # | Name | # | Name | # | Name |
|---|---|---|---|---|---|
| 1 | Parameters Version | 64 | ESD Test Max Value | 127 | Hydr Level |
| 2 | Cylinder Bore Diameter | 65 | ESD Test Max Current | 128 | Primary Position Feedback |
| 3 | Cylinder Rod Diameter | 66 | Lock In Place Test Min Value | 129 | Secondary Position Feedback |
| 4 | Max Stroke Length | 67 | Lock In Place Test Min Current | 130 | Pos Cmd Gain |
| 5 | Init Stroke Length | 68 | Lock In Place Test Max Value | 131 | Pos Cmd Offset |
| 6 | Overlap Stroke Length | 69 | Lock In Place Test Max Current | 132 | LDT1 Gain |
| 7 | Valve Port Open Area @ 0% | 70 | Hydr Temp Min Value | 133 | LDT1 Offset |
| 8 | Valve Port Open Area @ Overlap | 71 | Hydr Temp Min Current | 134 | LDT2 Gain |
| 9 | Valve Port Open Area @ 10% | 72 | Hydr Temp Max Value | 135 | LDT2 Offset |
| 10 | Valve Port Open Area @ 20% | 73 | Hydr Temp Max Current | 136 | Cylinder 1 Press Gain |
| 11 | Valve Port Open Area @ 30% | 74 | Hydr Level Min Value | 137 | Cylinder 1 Press Offset |
| 12 | Valve Port Open Area @ 40% | 75 | Hydr Level Min Current | 138 | Cylinder 2 Press Gain |
| 13 | Valve Port Open Area @ 50% | 76 | Hydr Level Max Value | 139 | Cylinder 2 Press Offset |
| 14 | Valve Port Open Area @ 60% | 77 | Hydr Level Max Current | 140 | ESD Acc Press Gain |
| 15 | Valve Port Open Area @ 70% | 78 | Servo Max Speed Error | 141 | ESD Acc Press Offset |
| 16 | Valve Port Open Area @ 80% | 79 | Servo Max Speed Current | 142 | Main Hydr Press Gain |
| 17 | Valve Port Open Area @ 90% | 80 | Servo Min Speed Error | 143 | Main Hydr Press Offset |
| 18 | Valve Port Open Area @ 100% | 81 | Servo Min Speed Current | 144 | Pump 1 Disch Press Gain |
| 19 | Valve Discharge Coefficient | 82 | Servo Deadband Error | 145 | Pump 1 Disch Press Offset |
| 20 | Remote Cmd Min Value | 83 | Servo Current Direction | 146 | Pump 2 Disch Press Gain |
| 21 | Remote Cmd Min Current | 84 | Pos Fdbk 1 Min Current | 147 | Pump 2 Disch Press Offset |
| 22 | Remote Cmd Min LOC Current | 85 | Pos Fdbk 1 Max Current | 148 | ESD Test Press Gain |
| 23 | Remote Cmd Max Value | 86 | Pos Fdbk 2 Min Current | 149 | ESD Test Press Offset |
| 24 | Remote Cmd Max Current | 87 | Pos Fdbk 2 Max Current | 150 | LockInPlace Test Press Gain |
| 25 | Remote Cmd Max LOC Current | 88 | Loss of Tracking Tolerance | 151 | LockInPlace Test Press Offset |
| 26 | LDT 1 Min Value | 89 | Loss of Tracking Timeout | 152 | Hydr Temp Gain |
| 27 | LDT 1 Min Current | 90 | Dither | 153 | Hydr Temp Offset |
| 28 | LDT 1 Min LOF Current | 91 | DVC Mixing Fan Setpoint | 154 | Hydr Level Gain |
| 29 | LDT 1 Max Value | 92 | High Temp Rsvr Fluid Setpoint | 155 | Hydr Level Offset |
| 30 | LDT 1 Max Current | 93 | Low Level Rsvr Fluid Setpoint | 156 | Servo Gain |
| 31 | LDT 1 Max LOF Current | 94 | Pump 1 Low Pressure Setpoint | 157 | Servo Offset |
| 32 | LDT 2 Min Value | 95 | Pump 2 Low Pressure Setpoint | 158 | Pos Fdbk 1 Gain |
| 33 | LDT 2 Min Current | 96 | Main Hydr Low Pressure Setpoint | 159 | Pos Fdbk 1 Offset |
| 34 | LDT 2 Min LOF Current | 97 | Esd Acc Low Pressure Setpoint | 160 | Pos Fdbk 2 Gain |
| 35 | LDT 2 Max Value | 98 | Cylinder 1 High Pressure Setpoint | 161 | Pos Fdbk 2 Offset |
| 36 | LDT 2 Max Current | 99 | Cylinder 2 High Pressure Setpoint | 162 | IP Address Byte 1 |
| 37 | LDT 2 Max LOF Current | 100 | ESD Test High Pressure Setpoint | 163 | IP Address Byte 2 |
| 38 | ESD Acc Min Value | 101 | LIP Test Low Pressure Setpoint | 164 | IP Address Byte 3 |
| 39 | ESD Acc Min Current | 102 | Opening Thrust High Setpoint | 165 | IP Address Byte 4 |
| 40 | ESD Acc Max Value | 103 | Closing Thrust High Setpoint | 166 | IP Subnet Mask Byte 1 |
| 41 | ESD Acc Max Current | 104 | Closing Thrust Override Setpoint | 167 | IP Subnet Mask Byte 2 |
| 42 | Main Hydr Min Value | 105 | High Temp Rsvr Fluid Switch | 168 | IP Subnet Mask Byte 3 |
| 43 | Main Hydr Min Current | 106 | Low Level Rsvr Fluid Switch | 169 | IP Subnet Mask Byte 4 |
| 44 | Main Hydr Max Value | 107 | Pump 1 Low Press Switch | 170 | IP Gateway Byte 1 |
| 45 | Main Hydr Max Current | 108 | Pump 2 Low Press Switch | 171 | IP Gateway Byte 2 |
| 46 | Pump 1 Disch Min Value | 109 | Main Hydr Low Press Switch | 172 | IP Gateway Byte 3 |
| 47 | Pump 1 Disch Min Current | 110 | Esd Acc Low Press Switch | 173 | IP Gateway Byte 4 |
| 48 | Pump 1 Disch Max Value | 111 | Handwheel Switch | 174 | IP Name Server Byte 1 |
| 49 | Pump 1 Disch Max Current | 112 | Limit Switch | 175 | IP Name Server Byte 2 |
| 50 | Pump 2 Disch Min Value | 113 | ESD Switch | 176 | IP Name Server Byte 3 |
| 51 | Pump 2 Disch Min Current | 114 | Lock In Place Switch | 177 | IP Name Server Byte 4 |
| 52 | Pump 2 Disch Max Value | 115 | Remote Cmd | 178 | Local / Remote |
| 53 | Pump 2 Disch Max Current | 116 | LDT 1 | 179 | English / Metric |
| 54 | Cylinder 1 Min Value | 117 | LDT 2 | 180 | Backlight, Turn Off |
| 55 | Cylinder 1 Min Current | 118 | Esd Acc Press | 181 | Passcode |
| 56 | Cylinder 1 Max Value | 119 | Main Hydr Press | 182 | Passcode No. |
| 57 | Cylinder 1 Max Current | 120 | Pump 1 Disch Press | 183 | Passcode No. |
| 58 | Cylinder 2 Min Value | 121 | Pump 2 Disch Press | 184 | Passcode No. |
| 59 | Cylinder 2 Min Current | 122 | Cylinder 1 Press | 185 | Passcode idle timeout |
| 60 | Cylinder 2 Max Value | 123 | Cylinder 2 Press | | |
| 61 | Cylinder 2 Max Current | 124 | ESD Test Press | | |
| 62 | ESD Test Min Value | 125 | Lock In Place Test Press | | |
| 63 | ESD Test Min Current | 126 | Hydr Temp | | |

*Fig. 18*

ACTUATOR CONTROLLER FOR MONITORING HEALTH AND STATUS OF THE ACTUATOR AND/OR OTHER EQUIPMENT

CROSS-REFERENCE TO RELATED APPLICATIONS

Benefit of U.S. Provisional Patent Application Ser. No. 60/696,115, filed Jul. 1, 2005, is hereby claimed and the disclosure incorporated herein by reference.

The disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates to valve controllers, and more particularly to digital valve controllers for controlling valves and/or valve actuators.

Conventional approaches for controlling valves typically involve analog valve controllers. Such controllers do not typically provide event logging, are not configurable, are not programmable, and are not scalable.

Furthermore, current valve controllers do not typically provide remote monitoring and control capability, don not properly support customer troubleshooting and training, don't adequately support automated health monitoring, diagnostics, and testing, and don't provide predictive maintenance. Current controllers aren't adequately customizable by either the customer or the vendor, and they do not adequately support easy setup.

It would be useful to provide a controller solution that mitigates one or more of the above shortcomings. Furthermore, a controller that supports redundant controllers and/or power supplies to increase controller reliability would also be useful.

BRIEF SUMMARY OF THE INVENTION

Provided is a device for controlling an actuator, the device is provided in an explosion-proof housing. A primary controller is sealed within the housing and is adapted for controlling one or more outputs connected to the actuator. A backup controller is mounted within the housing and adapted for alternatively controlling the one or more outputs connected to the actuator. An operator interface is provided on an outer surface of the housing for accepting operator inputs for providing to one or both of the primary controller and the backup controller. A display is provided on the outer surface of the housing for displaying an output of one or both of the primary controller and the backup controller. The device further includes means for monitoring for a failure of the primary controller. The device is adapted for automatically switching from the primary controller to the backup controller upon detecting the failure of the primary controller, such that the functions of controlling of the one or more outputs, the providing of the operator inputs, and the displaying an output are all transferred from the primary controller to the backup controller upon the automatic switching.

Further provided is a device for controlling an actuator, the device provided in a housing having an opening sealed by a door, the door having an outer surface. A controller mounted within the housing and adapted for controlling one or more outputs having variable current or voltage setup ranges are connected to the actuator for controlling an operation of the actuator, wherein the setup ranges are operator configurable. An operator interface accepts operator settings for input to the controller without opening the door. A display and/or indicator on the outer surface of the housing displays an output of the controller. The controller is adapted for configuring the setup ranges of the outputs based on the operator settings, thereby configuring the output setup ranges without breaking the seal formed by the door.

Further provided is a device for controlling an actuator, the device provided in a housing having an outer surface. A controller is mounted within the housing and is adapted for controlling one or more outputs connected to the actuator for controlling an operation of the actuator. A data input interface receives data from the actuator and/or from other equipment being acted on by the actuator. A memory stores expected parameters of the actuator. An operator interface is provided on the outer surface of the housing for accepting operator commands and/or settings for input to the controller. A display and/or indicator is provided on the outer surface of the housing for displaying an output of the controller. The controller is adapted for comparing the data, and/or derived parameters of the data, with the expected parameters, to monitor a health and status of one or both of the actuator and the other equipment. The controller is further adapted to indicate the health and the status to the operator utilizing the display and/or indicator.

Further provided is a device for controlling an actuator, the device provided in a housing having an outer surface. A controller is mounted within the housing adapted for controlling one or more outputs connected to the actuator for controlling an operation of the actuator. A data input interface for receives data from the actuator and/or from other equipment being acted on by the actuator. An operator interface including a plurality of input devices provided on the outer surface of the housing accepts operator commands and/or settings for input to the controller. A display on the outer surface of the housing displays an output of the controller. The controller is adapted for serving data to a remote terminal, operated by a remote operator, the remote terminal connected to the device via a computer network and adapted to receive the served data in order to: reproduce graphically the display on a display of the remote terminal for viewing by a remote operator of the remote terminal such that the remote operator can view the output of the controller, and reproduce or emulate the operator interface on the remote terminal for the remote operator entering the operator commands and/or settings for input to the controller from the remote location.

Further provided is a device for controlling an actuator, the device provided in a housing having an outer surface. A controller is mounted within the housing adapted for controlling one or more outputs connected to the actuator for controlling an operation of the actuator. A data input interface receives data from the actuator and/or from other equipment being acted on by the actuator. An operator interface includes a plurality of input devices provided on the outer surface of the housing for accepting operator commands and/or settings for input to the controller. A display on the outer surface of the housing for displays an output of the controller. The processor is adapted for recording a plurality of events and faults based on the operation of two or more of the device, the actuator, and the other equipment. The events and faults can be displayed to an operator utilizing the display in a manner allowing the operator to browse the events and faults.

Also provided are additional embodiments of the invention, including variations of the above, and some, but not all of which, are described hereinbelow.

BRIEF DESCRIPTION OF THE DRAWINGS

The features and advantages of the examples of the present invention described herein will become apparent to those skilled in the art to which the present invention relates upon reading the following description, with reference to the accompanying drawings, in which.

DETAILED DESCRIPTION OF THE EXAMPLE EMBODIMENTS

Provided is a Digital Valve Controller (DVC) for supporting various valve applications (e.g. plug and slide valves, among others). Note that is this description, a "controller" component may include various controller and processor devices. These are basically programmable components, which may, or may not, be discrete, that are utilized for receiving various inputs for processing, and providing various outputs to control various devices, and a "controller", as used in this document, may include a "processor", where appropriate.

Figure 1:
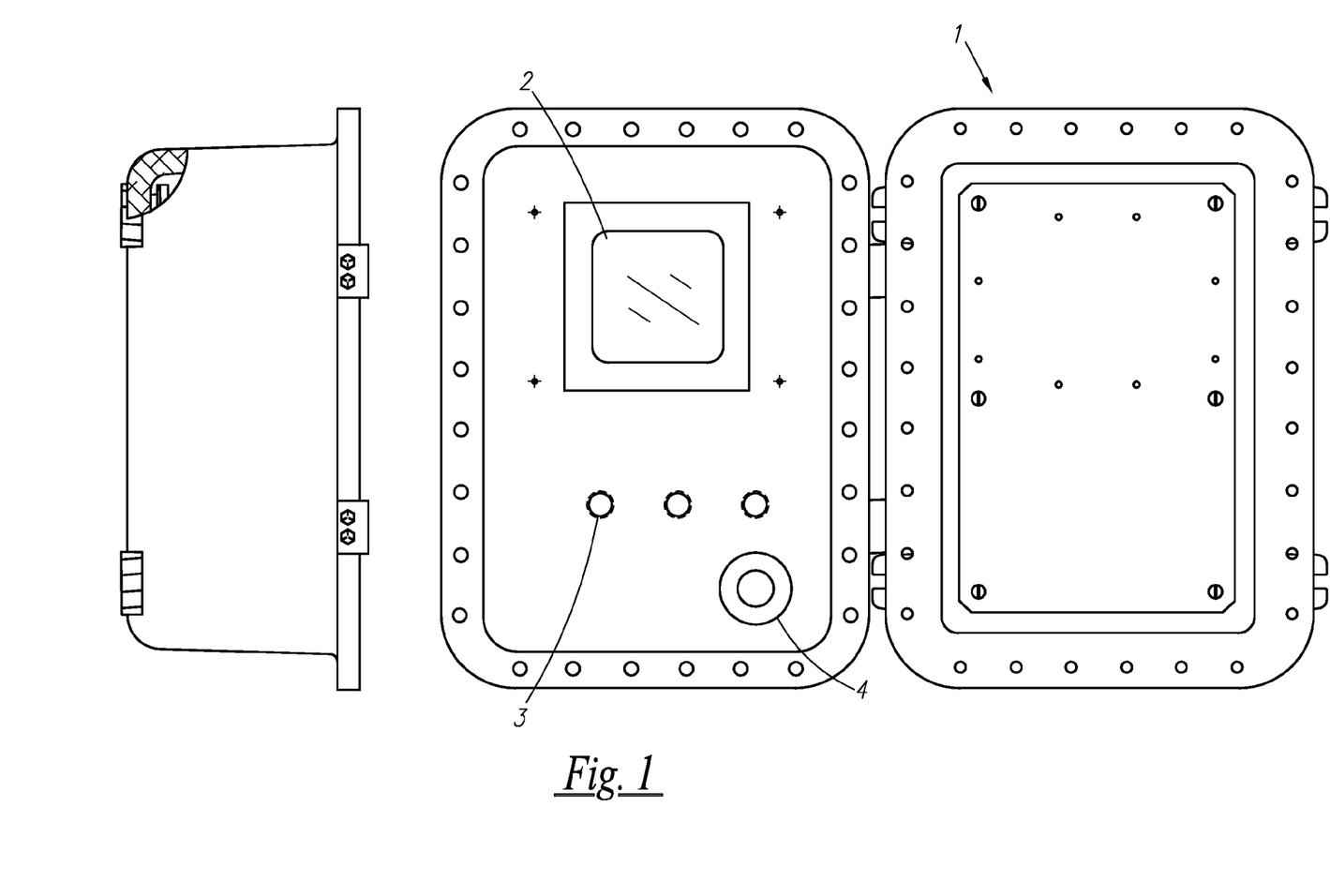
FIG. 1 is a drawing of the front panel and the case according to an example embodiment.

The DVC is housed in an enclosure or a case, such as an explosion-proof case, for example. FIG. 1 is a drawing of an embodiment of a DVC front panel and explosion-proof case 1 according to an example embodiment. A 5.5 inch color, quarter VGA display 2 provides a friendly "WINDOWS-like" Graphical User Interface (GUI). In an example embodiment, the display 2 is mounted to the inside cover of the explosion-proof case 1. The DVC GUI can be set to display values in English or Metric units. The GUI interface of the example embodiment is controlled via three pushbuttons 3 and an optical shaft encoder 4 located on the front of the DVC. The DVC is a stand-alone system. Most, or even all, of the embedded features of the DVC can be accessed and controlled via the front panel without opening the explosion proof container. There are no internal adjustments which require the opening of the explosion-proof case. Additional devices (e.g. handheld devices and/or a laptop) are not required to access DVC embedded features, but such features can be made accessible to such devices, if desired.

The explosion-proof case is capable of withstanding an explosion of a specified gas or vapor that may occur within it, and is also capable of preventing the ignition of a specified gas or vapor surrounding the enclosure by sparks, flashes, or explosion of the gas or vapor within and that operates at such an external temperature that a surrounding flammable atmosphere will not be ignited thereby.

Using the front panel GUI, or a "WINDOWS-based" NetDVC application that might be made accessible remotely, the operator can configure the DVC to suit a wide-range of systems. For example, optional sensors can be individually enabled or disabled which allows the DVC to replace obsolete controllers with minimal changes to the system. Later on, as sensors are added, they can typically be enabled without modifying the DVC hardware or software. All setup information can be stored in nonvolatile flash memory within the DVC. Setup information can be transferred to a laptop (or other portable or remote device) for analysis, modification and storage. Stored setup files can be transferred to a DVC as part of initial setup, troubleshooting and/or recovery. Using the front panel GUI, the operator can also calibrate the various DVC analog inputs and outputs. This calibration information can be stored in a memory, such as a nonvolatile flash memory, for example, within the DVC.

Figure 2:
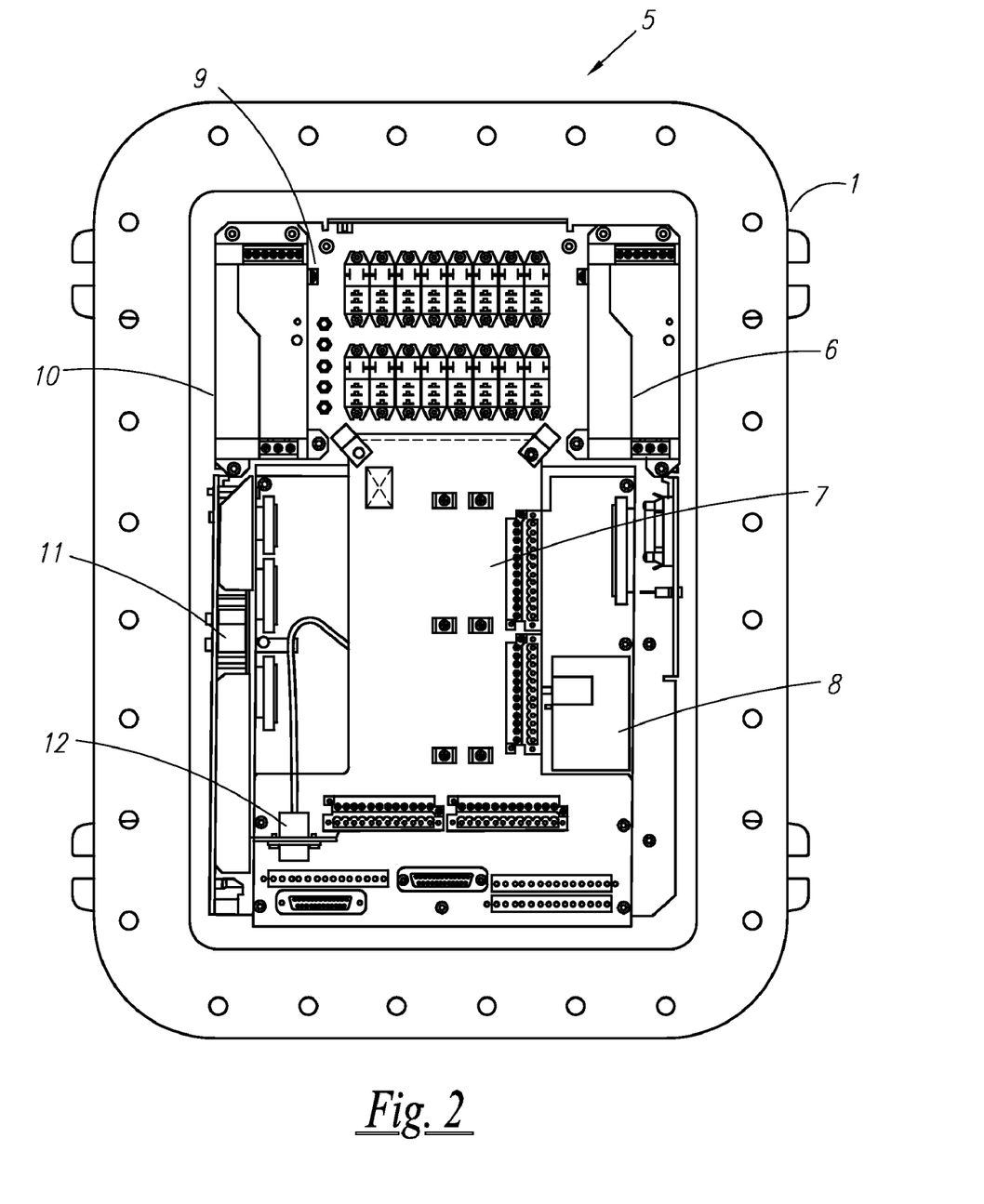
FIG. 2 shows various internal components of the DVC according to an example embodiment.

FIG. 2 shows various internal components of the DVC, according to an example embodiment. This example DVC, which optionally implements redundancy, has a processor board 8, Ethernet connector 12, a site for an optional backup controller (which is hidden from view), a primary power supply 10, a backup power supply 6, an I/O plate 7, relays 9 and transient voltage protection 11.

If the optional backup controller is provided in the unit, the backup controller automatically takes over and restores operation when the primary controller fails, and the operator is notified of the transition to the backup controller. The primary controller sends a keep-alive message over a serial port to the backup controller (if present) during normal operation. If the backup controller fails to receive the keep-alive within the timeout period setting, the backup controller takes control of the system. The backup controller will also take control if commanded to do so by the primary controller, or by an operator. The primary controller can notify the backup controller to take control by the primary controller sending a switch character over the same serial port, or some other bus.

The timeout period to switch to backup is typically short, a half second for example, but the primary controller may request the timeout to be extended, to 15 seconds for example, for special processing. This request for an extended timeout is done by the primary controller sending an extended time character to the backup.

For the example embodiment, the electronics for the DVC are provided on 2 printed wiring cards (card A and card B). Card A has the primary controller functionality and the input processing circuitry and is located under the I/O plate 7. Card B has the Backup Controller functionality and the output interfaces and is located under Card A. Both cards of the example embodiment use Z-WORLD's 3360 Core Processor Modules. The 3360 includes a RABBIT 3000 processor running at 44 MHz, an Ethernet port, 512K nonvolatile flash memory, 512K RAM, 52 I/O lines to interface with their respective cards, 6 serial ports, a real time clock, a quadrature decoder and an XD memory card slot. The processors on Card A (primary controller) and Card B (backup controller) communicate with each other via a dedicated serial interface. The processors on Card A and Card B communicate via their Ethernet interfaces with a laptop running the NetDVC program.

Of course, alternative controllers (processors) could also be utilized, as desired.

The I/O 7 plate on the DVC includes the following example inputs and outputs shown in Table 1, below:

| 4-20 mA Inputs | Digital Inputs | 4-20 mA Outputs | Digital Outputs |
|---|---|---|---|
| Valve position command | ESD accumulator low pressure | LDT position (qty2) | ESD accumulator low |
| LDT position (qty2) | Pump 1 low pressure | | Pump 1 low pressure |
| Cylinder 1 pressure | Pump 2 low pressure | | Pump 2 low pressure |
| Cylinder 2 pressure | High temperature reservoir | | High temperature reservoir fluid |
| | | Servo Outputs | |
| ESD accumulator pressure | Low level reservoir fluid | Redundant +/− 60 ma | Low level reservoir fluid |
| Main hydraulic pressure | Limit Switch | | Main hydraulic low pressure |
| Pump 1 discharge pressure | Handwheel engaged | | Loss of command |
| Pump 2 discharge pressure | Main Hydraulic low pressure | | Loss of feedback |
| ESD test pressure | | | Loss of tracking |
| Lock in place pressure | | | |
| Hydraulic temperature | | | |
| Hydraulic reservoir fluid level | | | |

The outputs are configurable in the example embodiment. For example, the Solenoid Current output that controls the valve can be configured using five parameters, Dead Band, Servo Maximum Current, Servo Minimum Current, Maximum Speed Error and Minimum Speed Error. If the valve deviation error is greater than the Maximum Speed Error parameter the valve will move toward the correct position using the Maximum Servo Current parameter. If the valve deviation error is between the Maximum Speed Error parameter and the Minimum Speed Error parameter the valve will move toward the correct position using a servo current between the Servo Maximum Current and the Servo Minimum Current that is proportional to the valve deviation error. If the valve deviation error is between the Minimum Speed Error parameter and the Dead Band the valve will move using a servo current equal to the Minimum Speed Current parameter. If the valve deviation error is less than the Dead Band parameter the valve will not move.

Figure 3:
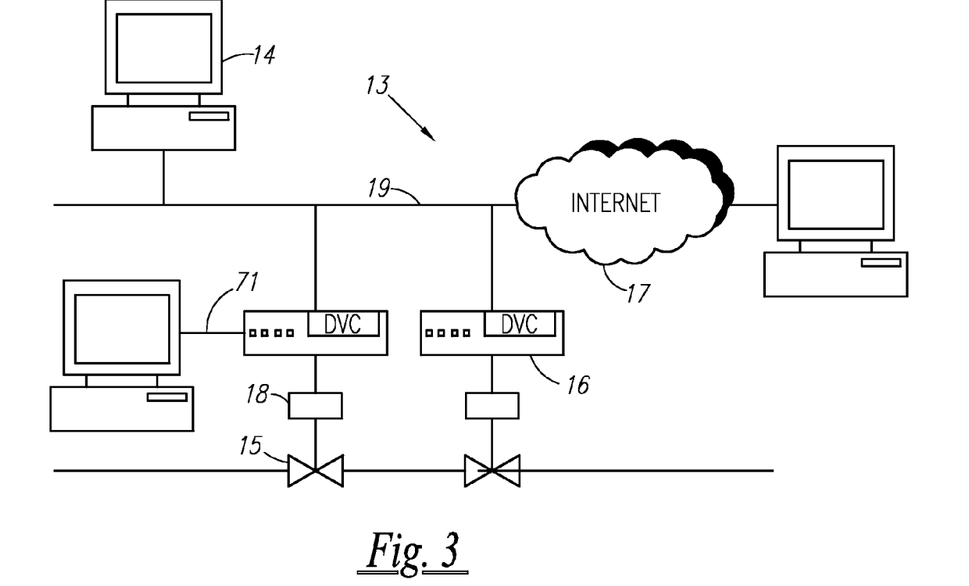
FIG. 3 shows a network diagram of the DVC in communication with a controller and a terminal.

FIG. 3 shows a network diagram of the example DVC 16 in communication with valve 15 via the actuator 18. In addition to being able to control the DVC via the front display 2, the DVC can also be controlled via a workstation 14, which connects to the DVC through a Local Area Network 19, via a WAN such as the Internet 17, or directly to the DVC through the Ethernet connector 71. Each controller within the DVC can be assigned a static IP address to support the TCP/IP standard so that it can be uniquely identified and communicated with. However, other network protocols could also be supported.

Figure 4:
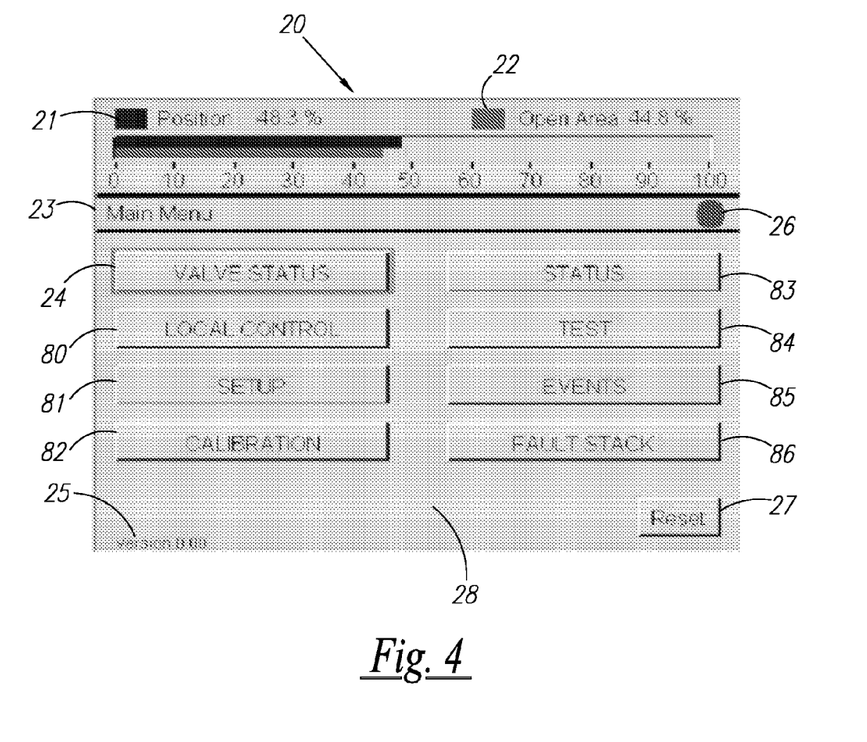
FIG. 4 shows a close-up of the DVC front panel display according to an example embodiment.

FIG. 4 shows a close-up of the example embodiment DVC display screen 20 according to an example embodiment. The display utilizes a 5.5 inch active matrix quarter VGA color LCD screen 2. The screen is partitioned into three areas. In the example embodiment, the top of the screen always shows the valve position 21 and valve port open 22 area. The title bar 23 always shows the title of the current screen being displayed in the dynamic screen area and the Fault indicator 26. The Fault indicator is green if there are no faults on the Fault Stack 37 or red if there are faults on the Fault Stack 37. The middle of the screen 28 is dynamic and displays the current screen. The lower left hand corner of the screen toggles between the DVC date and time, the version of the DVC software and the status of the Ethernet link. The reset button 27 is used to reset the DVC. Valve Status Button 24 is used to access the Valve Status screen 72 of the DVC.

Figure 9:
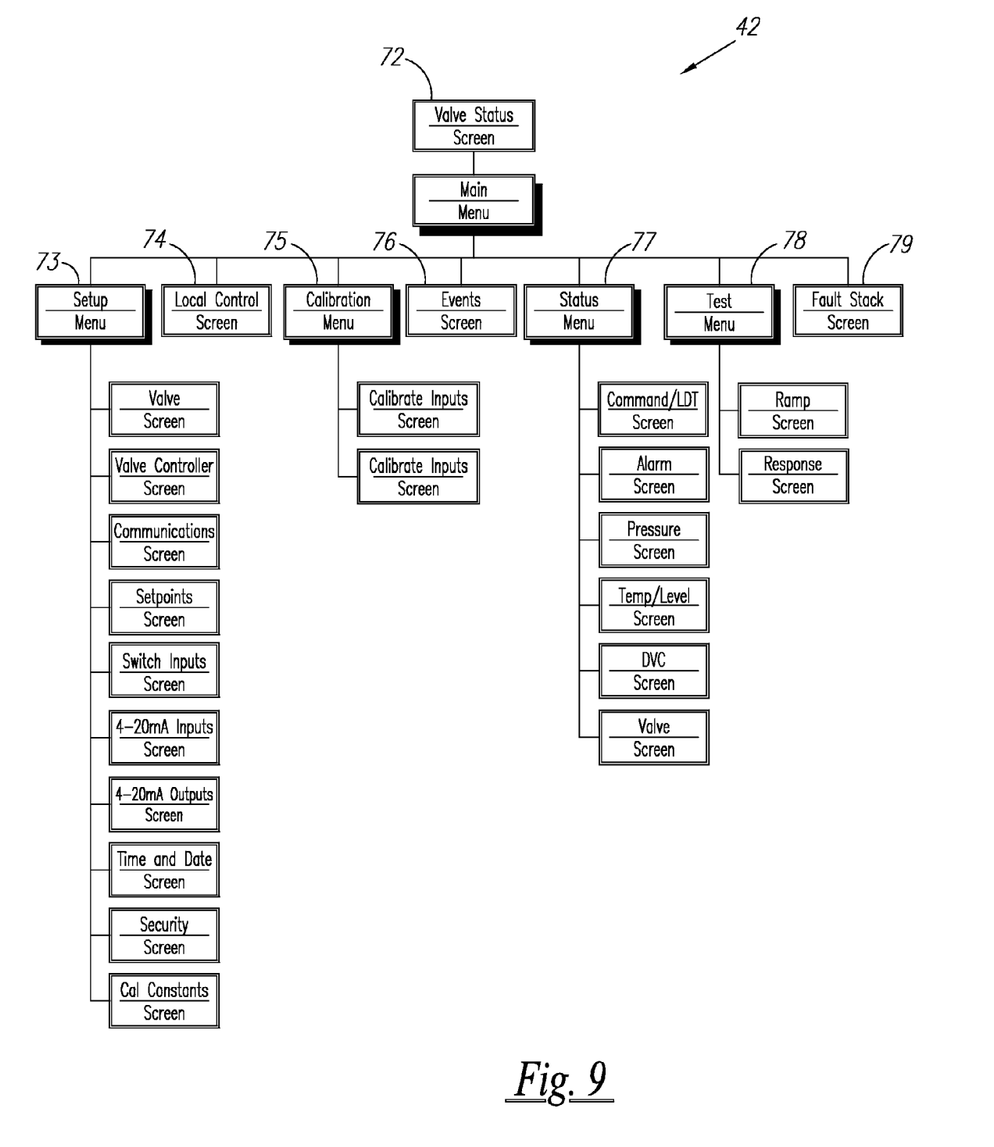
FIG. 9 shows the menu structure of the DVC according to an example embodiment.

FIG. 9 shows, for the example embodiment, a menu structure 42 of the DVC. Local Control Button 80 is used to access the local control screen 74. Setup Button 81 is used to access the Setup menu 73 from which various setup screens may be accessed. Calibration Button 82 is used to access the Calibration menu 75 from which either the Calibrate Inputs screen or the Calibrates Output screen may be accessed. Status Button 83 is used to access the Status menu 77 from which various status screens may be accessed. Test Button 84 is used to access the Test menu 78 from which either the Ramp or Response screen may be accessed. Events Button 85 is used to access the Events screen 76. Furthermore, Fault Stack Button 86 is used to access the Fault Stack screen 79.

Figure 5:
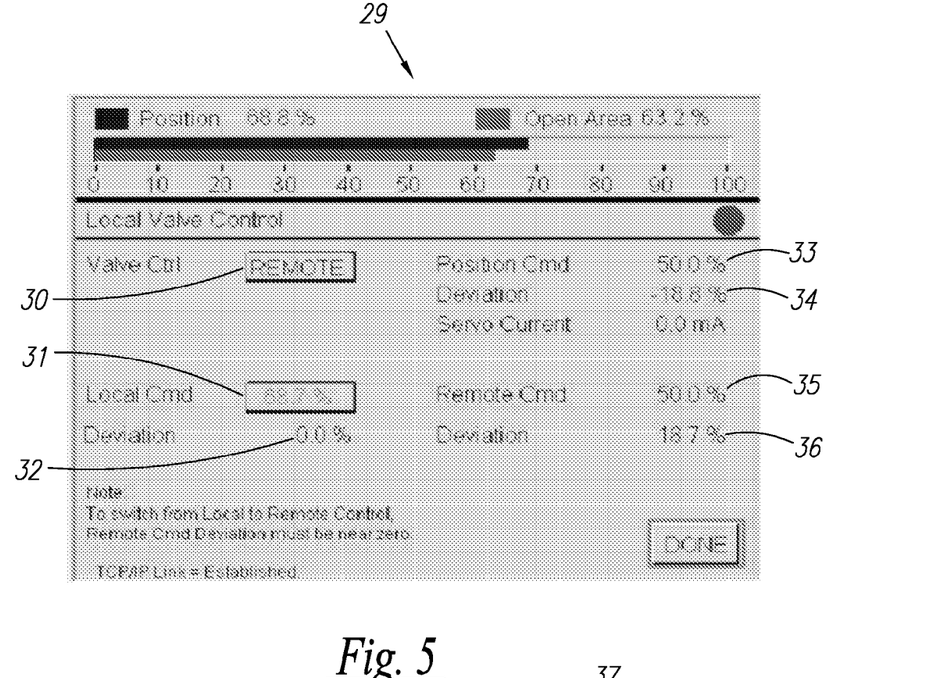
FIG. 5 shows the Local Valve Control screen of the DVC according to an example embodiment.

FIG. 5 shows the Local Valve Control Screen 29 according to the example embodiment. Normally, the valve position command is provided by a distributed control system (DCS) located in a control room, for example. This screen 29 allows the local or remote operator to control the valve position from the front panel of the DVC using various operator interface devices. The Local Valve Control screen displays the current valve control status 30, the current valve position command 33 and the deviation 34 (the difference between the actual valve position and the commanded valve position), the local command value 31 and the deviation 32, remote command value 35 and deviation 36, and the current in mA being supplied to the servo amplifier, which controls valve movement. In addition, this screen provides automatic "bumpless" transfers (meaning the valve doesn't move or moves minimally) when switching from remote control to local control. To facilitate "bumpless" transfers when going from local to remote control, the screen requires the remote command be within 1% of the actual valve position before allowing the transfer, thus ensuring bumpless transfer.

Figure 7:
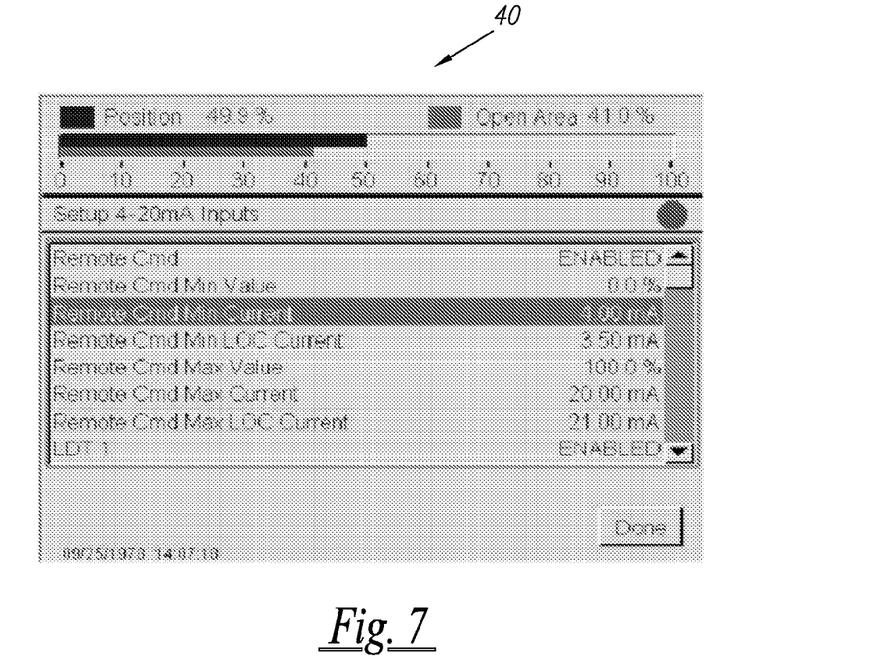
FIG. 7 shows the Programmable Parameter Setup Screen of the DVC according to an example embodiment.

FIG. 7 shows a Programmable Parameter Setup Screen 40 of the DVC according to an example embodiment. The Programmable Parameter Setup Screens 40 allows the operator to perform the following tasks:

Modify valve parameters;

Configure the DVC;
Setup Ethernet communications parameters;
Modify alarm set points;
Customize the 4-20 mA inputs and outputs;
Set the DVC time and date;
Setup DVC security options; and
Modify calibration parameters.

Figure 8:
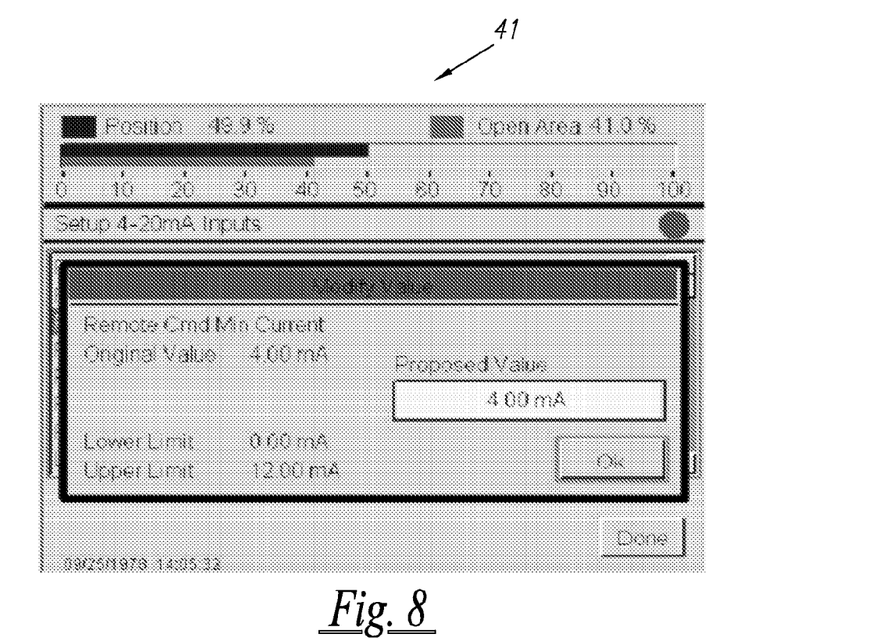
FIG. 8 shows the Modify Value popup dialog box which is used in conjunction with the Programmable Parameter Setup Screen.

FIG. 8 shows the Modify Value Dialog Box 41 of the DVC according to the example embodiment. This dialog box is displayed by the Programmable Parameter Setup Screen when a parameter is being modified. It displays the parameter name, the parameters original value, the upper and lower limits for the parameter and a proposed value for the parameter. The operator uses the optical shaft encoder 4 to increment or decrement the proposed parameter value to the desired value. Once the desired value is reached the operator presses the "OK" button to store the new parameter value into nonvolatile flash memory.

Figure 18:
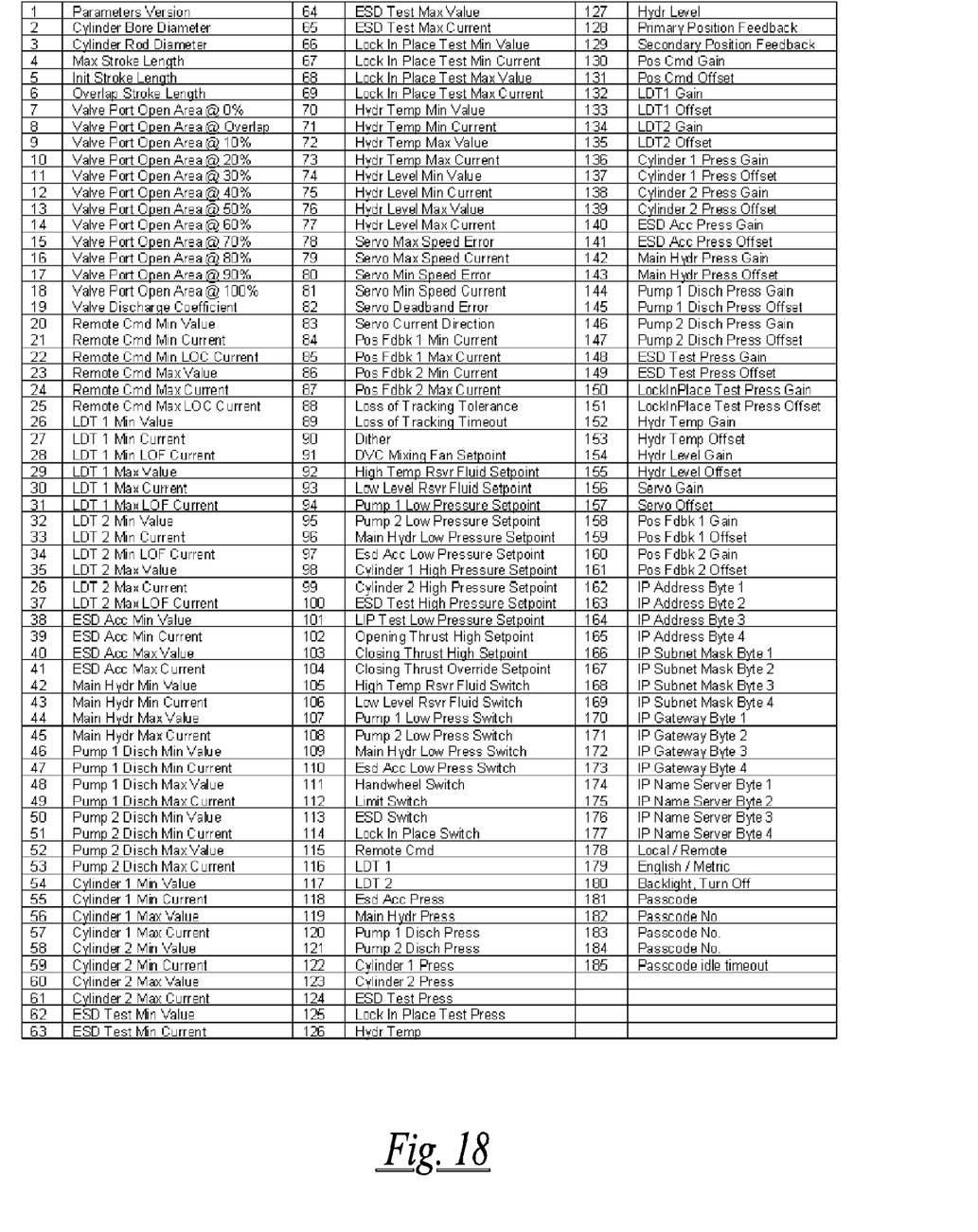
FIG. 18 shows the programmable parameters of the DVC according to an example embodiment.

FIG. 18 shows a list of 185 programmable parameters that can be used by the DVC according to the example embodiment.

The DVC provides a NetDVC feature that allows remote monitoring and control of the DVC over a communication network. NetDVC utilizes a MS WINDOWS-based application, for example. A standard WINDOWS installation process can be used to install the application. NetDVC utilizes Ethernet, enabling communications using a point-to-point connection, over local networks (LANs), wide area networks (WANS) such as the Internet. Using NetDVC, a remote operator can view the same material that is being displayed on the DVC front panel display and control the DVC via a virtual front panel. The virtual front panel provides the same operator interface as the DVC front panel. In addition the larger display, keyboard and mouse of a remote computer NetDVC provides user friendly screens for monitoring controlling and programming the DVC. The operator can effectively push the pushbuttons and rotate the shaft encoder using the mouse and see the effect on the LCD as if he were a local user of the DVC. NetDVC provides the following features:
Remote monitoring and control;
Remote customer support;
Remote troubleshooting;
Remote training;
Remote programming and restoration of programmable parameters;
Remote viewing of the DVC local display;
Remote viewing of the DVC event log; and
Remote viewing and clearing of the DVC faults.

Figure 10:
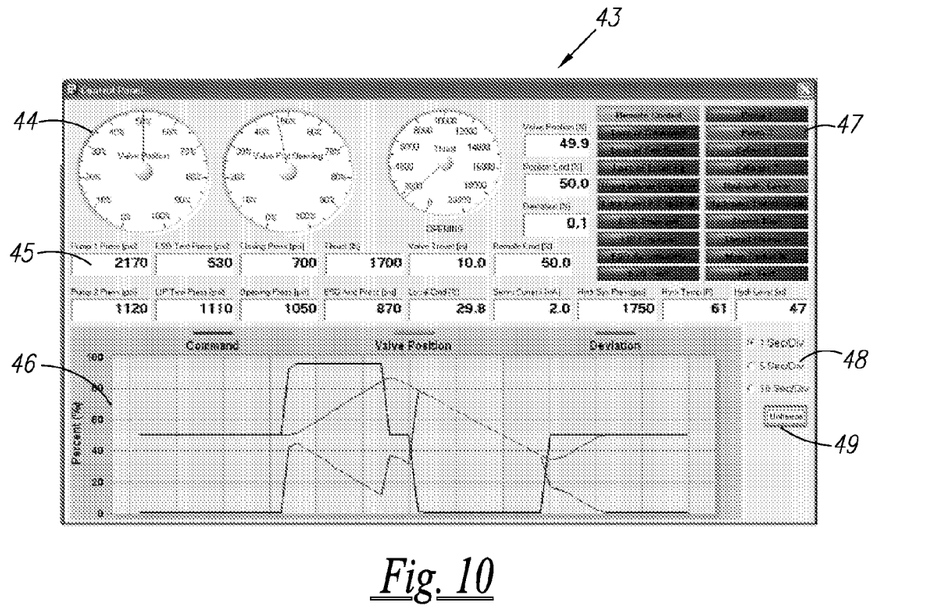
FIG. 10 shows the NetDVC Control Panel Screen of the DVC according to an example embodiment.

FIG. 10 shows the NetDVC Control Panel Screen 43 of the DVC according to the example embodiment. This screen provides remote system monitoring capability via a "dashboard" view of the DVC, including graphical gauges 44 and indicators 45 to show valve and Hydraulic Power Unit (HPU) status. In addition, this screen provides real-time graphs 46 of valve position versus command. The freeze button 49 is used to freeze and unfreeze the real time graph. Finally, Y axis time scaling options 48 and alarm indicators 47 are also made available.

Figure 11:
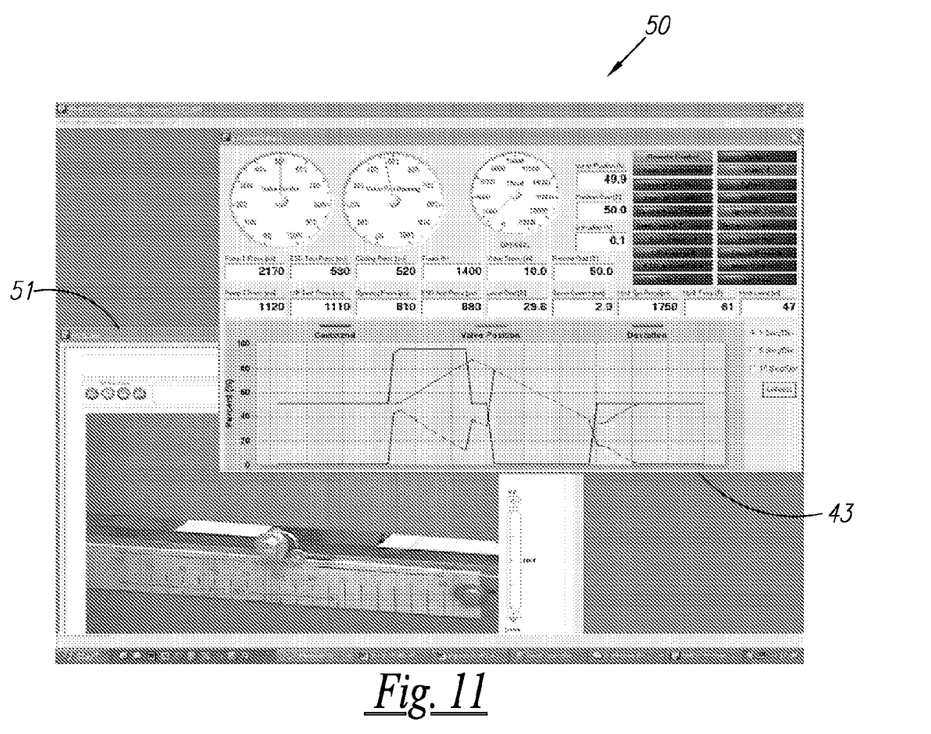
FIG. 11 shows the NetDVC Screen in Action of the DVC according to an example embodiment.
Figure 16:
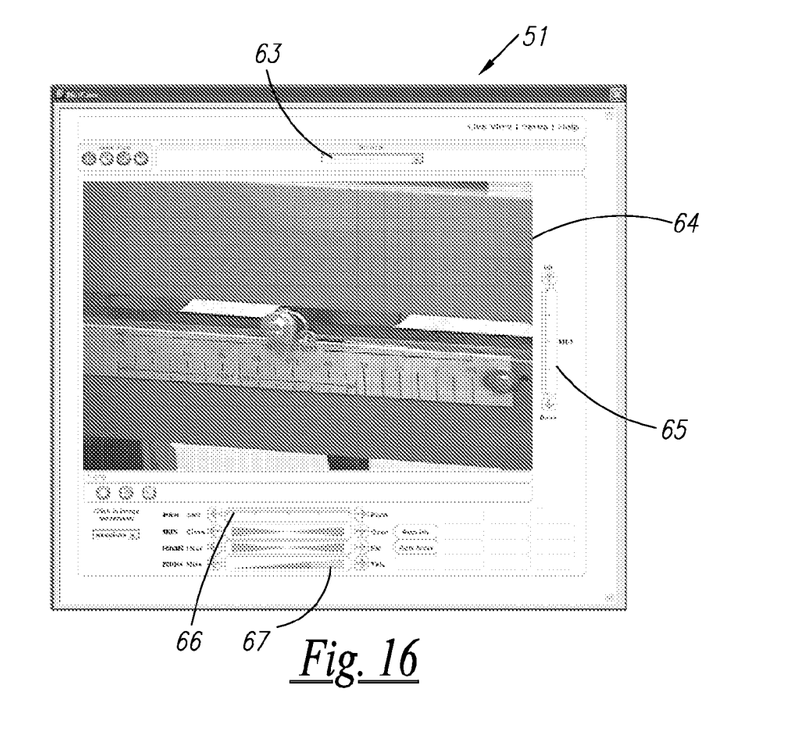
FIG. 16 shows the NetDVC NetCAM Screen of the DVC according to an example embodiment.

FIG. 11 shows, for the example embodiment, a collection of NetDVC Screens 50 including the Control Panel screen 43 and NetCAM screen 51. The NetCAM screen 51 allows remote viewing 64 of valve movements and HPU conditions. FIG. 16 shows a focused view of the NetCAM screen. Multiple preset camera positions can be selected from the preset list box 63 for displaying the live video. The NetCAM can be remotely controlled with the tilt 65, pan 66 and zoom 67 functions. As a result, a wide range of different directions can be viewed, including views of the pressure gauges, the valve position and the hydraulic fluid levels, for example.

Figure 12:
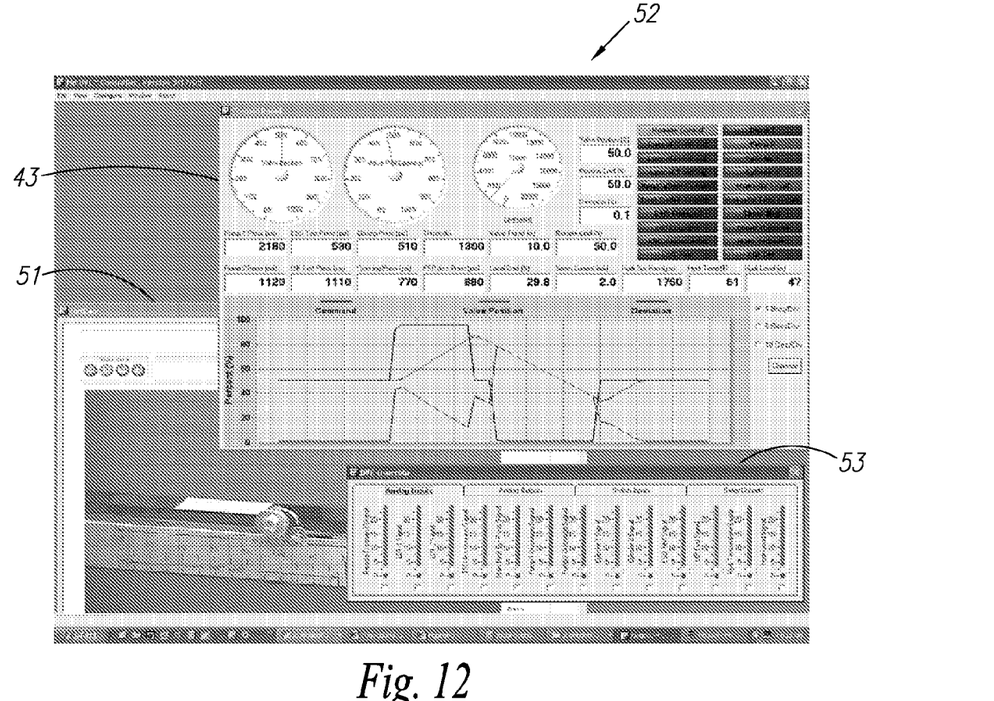
FIG. 12 shows the NetDVC Override Screen of the DVC according to an example embodiment.

FIG. 12 shows the NetDVC Override Screen 53 of the DVC according to the example embodiment. This screen allows an operator to remotely substitute values for any DVC inputs and outputs. It is useful for system test, simulation, troubleshooting, and training.

Figure 13:
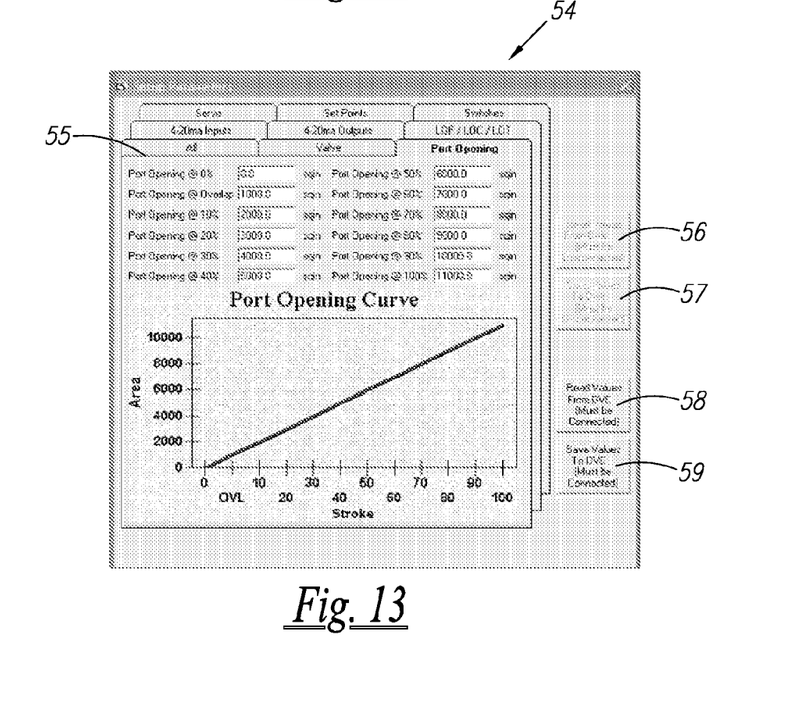
FIG. 13 shows the NetDVC Programmable Parameter Setup Screen of the DVC according to an example embodiment.

FIG. 13 shows the NetDVC Programmable Parameter Setup Screen 54 of the DVC according to the example embodiment. This screen allows remote management of DVC programmable parameters using a user-friendly tab interface 55 which groups the parameters into separate categories. Parameters can read from a disk 56, saved to a disk 57, read from the DVC 58 and written to the DVC 59.

The DVC of the example embodiment utilizes operator initiated tests, scheduled tests, continuous background tests, the Event Log, and the Fault Stack to create a comprehensive Predictive Maintenance program. During normal operation, non-disruptive tests utilizing small valve movements can automatically detect changes in valve response time and thrust requirements vs. valve position. These tests can be scheduled to run periodically, offering continuous or intermittent monitoring. The tests allow the DVC to monitor, for example, the health and status of the valve and/or valve actuator and to predict an impending failure of the same. If normal operation can be interrupted, the operator can run disruptive tests which cover even a greater range of valve movement.

Figure 17:
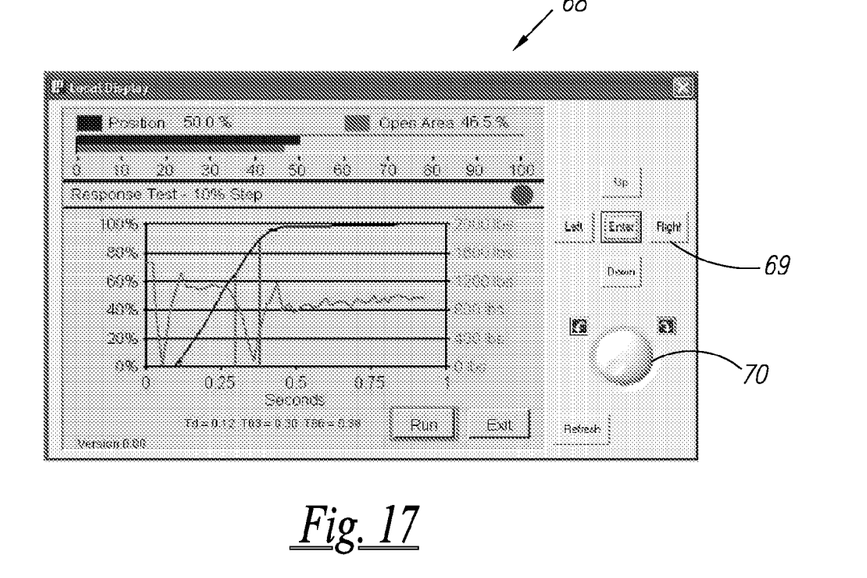
FIG. 17 shows the NetDVC Local Display Screen displaying a valve step response test according to an example embodiment.

FIG. 17 shows a NetDVC Local Display Screen displaying a Dynamic Step Response Test of the DVC according to the example embodiment. Dynamic Step Response Test: allows steps of −5, +10, −5% steps, for example, to generate a real-time step response curve marking the 63% and 86% transition times and thrust values to support a UOP specification response requirement. (UOP is an international supplier and licensor of process technology, catalysts, adsorbents, process plants, and consulting services to the petroleum refining, petrochemical, and gas processing industries.) The test begins, for example, by stepping the valve 5% in one direction for example. During the initial step, required thrust and time are monitored by the DVC. The valve then moves 10% in the opposite direction at which time test results are captured. Finally, the valve moves 5% back in the original direction, the net result being the valve is in the identical place as it was before the test was initiated. Force is also monitored to detect a sticky valve. In addition, thrust vs. valve position is displayed to facilitate preventative and predictive maintenance.

As the valve opens, open area typically does not increase in a linear relationship. Valve capacity and port opening are calculated using a 10 point piece-wise linear equation. When commissioning the valve, the operator provides the valve port opening at 10 predefined points of travel. This information is stored in nonvolatile flash memory, for example.

Opening and closing thrust values are calculated and compared to limits to insure safe operation. A normal signature curve is characterized. The operational response is then continuously compared against the signature. When commissioning the valve, the operator uses the DVC setup screens to provide the valve cylinder characteristics and operating limits. This information is stored in nonvolatile flash memory. If an unsafe thrust closing condition is encountered the valve is opened (which lowers thrust) until the thrust reaches a safe level.

Continuous background tests, as the name implies, are constantly being run to determine the health of the DVC. One such test is an input limit test which checks analog inputs to make sure they are not out of range. For example, if the input is less then 2.5 mA, or greater then 22.5 mA, for example, the input is "out of range" and an error will be reported. Another test is done on input values used during calculations to determine if the resulting calculated values are valid. For example, Valve Position Deviation depends on Valve Position and Valve Command. If either one of these values are invalid, Valve Position Deviation will be invalid. Additionally, all communications between the DVC and NetDVC contain checksums to ensure that messages are valid. Finally, throughout the software, there are checks for software integrity.

Figure 6:
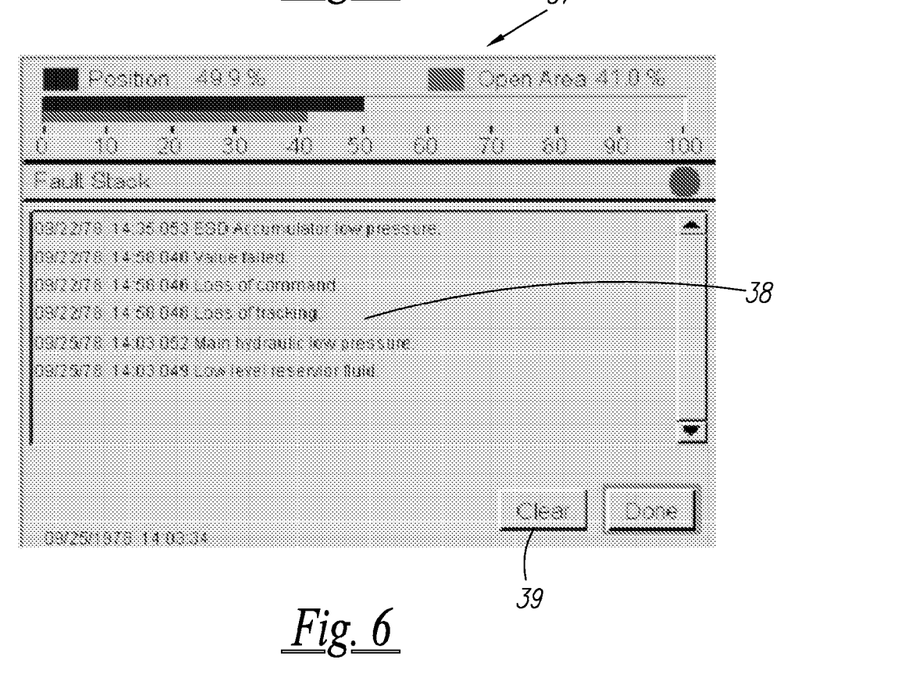
FIG. 6 shows the Fault Stack screen of the DVC according to an example embodiment.
Figure 14:
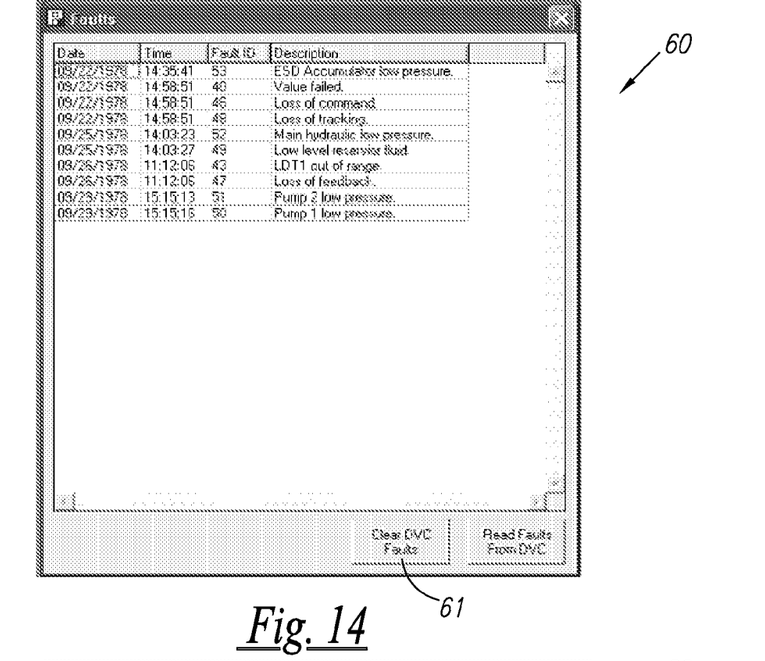
FIG. 14 shows the NetDVC Faults Screen of the DVC according to an example embodiment.

FIG. 6 shows the Fault Stack screen 37 of the DVC and FIG. 14 shows the NetDVC Faults Screen 60 of the DVC according to the example embodiment. This screen lists detected faults 38 along with date and time stamps in the order of occurrence. This information supports troubleshooting, health monitoring, and predictive maintenance. This enables small problems to be detected before they become large problems. Faults can be cleared by an operator via a Clear button 39. Once the fault is cleared, the fault indicator changes from red to green, to inform the operator that there are no faults on the fault stack. If an active fault is cleared, it is automatically placed back on the Fault Stack 38. All faults placed on the Fault Stack are also stored in the Event Log for future reference.

Figure 15:
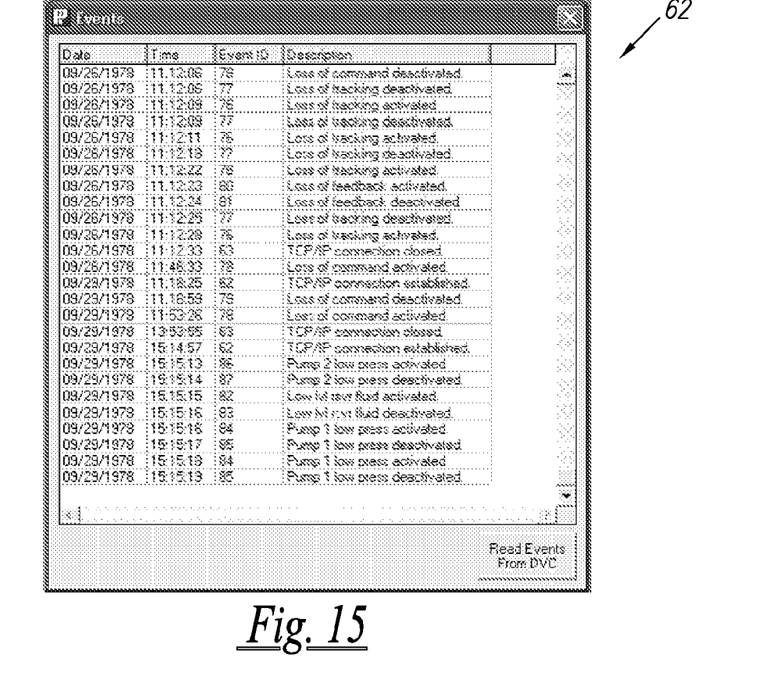
FIG. 15 shows the NetDVC Events Screen of the DVC according to an example embodiment.

FIG. 15 shows the NetDVC Events Screen 62 of the DVC according to the example embodiment. This screen allows remote viewing of thousands of system, operator, and fault events tagged with date and time. For example, when the operator executes a response time test the results of the test are saved as an event. The events are stored for approximately one year, so the operator can also trend valve performance over time to determine if the valve is slowing down or sticking, a precursor to potential valve failure. To maintain a proper timeline record, these events cannot be cleared by the operator. The events screen 62 is used in combination with the faults screen 60 as a diagnostic tool for troubleshooting.

The DVC design of the example embodiment utilizes Main Operating Loop (MOL) technology and a "C" compiler to create the embedded DVC software application. The MOL approach and "C" allow the DVC vendor to create a reliable, predictable and verifiable software application. A primary function of the DVC software is to read hardware inputs, perform calculations, and update the hardware outputs. These software operations are typically performed continuously based on interrupts. The interrupt performs the exact same operation each time it is executed, making the system deterministic. The advantage of the interrupt driven function is that the background tasks, like drawing to the display or handling operator inputs, do not effect performance of the critical function of controlling the valve.

Software that depends on a commercial operating system (e.g., LINUX or MS Windows) and a Graphical development environment (e.g., WINBUILD 5000) is only as deterministic as provided by the companies that developed the operating system and tools. It is not wise to depend on thousands or possibly millions of lines of unnecessary code. In addition to carrying extra, unused code, commercial operating systems waste valuable time performing housekeeping tasks which should be spent controlling and monitoring the valve. This makes it impossible to determine how a system will behave under all circumstances (non-deterministic).

Besides being non-deterministic, the source code for a commercial operating system and tool chain is either unavailable or too time consuming to review or modify. This makes it impossible to fully verify and support an application created with LINUX and WINBUILD 5000, for example. History has shown it can be problematic if the operating system vendors and tool manufacturers obsolete the product, or go out of business. It is for these reasons that all critical applications developed for the vendor's military customers use MOL technology and "C" compilers. Operating systems which are inherently non-deterministic and graphical development environments which hide software details and make long term support impossible are not allowed.

The DVC of the example embodiment is backward compatible. The DVC utilizes 4-20 mA inputs and provides digital I/O to implement back fits without modifying sensors and limit switches found on most Hydraulic Power Units (HPU) with which the DVC is typically used. In addition, the DVC configuration menus allow sensors to be activated, deactivated and customized in the field via the front panel controls or over NetDVC, without modifying the DVC software.

The invention has been described hereinabove using specific examples and embodiments; however, it will be understood by those skilled in the art that various alternatives may be used and equivalents may be substituted for elements and/or steps described herein, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A device for controlling an actuator, said device comprising:

a controller mounted within an explosion-proof housing having an outer surface, said controller being adapted for controlling one or more outputs connected to the actuator for controlling an operation of the actuator;

a data input interface for receiving data from the actuator and/or from other equipment being acted on by said actuator;

a memory for storing expected parameters of said actuator;

an operator interface provided on the outer surface of the housing for accepting operator commands and/or settings for input to said controller; and a display on the outer surface of the housing for displaying an output of said controller, wherein said controller is adapted for comparing said data, and/or derived parameters of said data, with said expected parameters, to monitor a health and status of one or both of the actuator and the other equipment, wherein said controller is further adapted to indicate the health and the status to the operator utilizing said display, wherein said controller is also adapted for executing a pre-programmed dynamic step response test of the actuator for generating said data, and wherein the pre-programmed dynamic step response test is executed under a normal operating condition of the actuator without taking the actuator off-line, and wherein said controller is also adapted to indicate actuator thrusts and respective corresponding positions that occur during the pre-programmed dynamic step response test, utilizing said display.

2. The device of claim 1 wherein: said controller is also adapted for determining an impending failure of one or both of the actuator and the other equipment based on said comparing, and said controller is further adapted for notifying the operator or another operator of the impending failure.

3. The device of claim 1, wherein the controller is a primary controller, the device further comprising:
a backup controller mounted within the explosion-proof housing; and
means for monitoring for a failure of said primary controller; wherein
said device is adapted for automatically switching from said primary controller to said backup controller upon detecting the failure of said primary controller, such that the functions of said controlling of said one or more outputs, said providing of said operator inputs, and said displaying an output are all transferred from said primary controller to said backup controller upon said automatic switching.

4. The device of claim 1, wherein said health and status are indicated to a remote operator accessing said device via the Internet.

5. The device of claim 4, wherein an image, captured by a camera, of the actuator and/or other equipment is displayed to the remote operator accessing said device via the Internet.

6. The device of claim 1, wherein
said controller is adapted for serving data to a remote terminal, operated by a remote operator, said remote terminal connected to said device via a computer network and adapted to receive said served data in order to:
reproduce graphically said display on a display of the remote terminal for viewing by a remote operator of said remote terminal such that the remote operator can view said output of said controller, and
reproduce or emulate said operator interface on said remote terminal for said remote operator entering said operator commands and/or settings for input to said controller from the remote location.

* * * * *

UNITED STATES PATENT AND TRADEMARK OFFICE
CERTIFICATE OF CORRECTION

PATENT NO. : 7,636,613 B2
APPLICATION NO. : 11/427868
DATED : December 22, 2009
INVENTOR(S) : Borah et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 536 days.

Signed and Sealed this

Ninth Day of November, 2010

David J. Kappos
*Director of the United States Patent and Trademark Office*